(12) United States Patent
Kimura et al.

(10) Patent No.: US 6,697,399 B2
(45) Date of Patent: Feb. 24, 2004

(54) SEMICONDUCTOR LASER MODULE WITH PELTIER MODULE FOR REGULATING A TEMPERATURE OF A SEMICONDUCTOR LASER CHIP

(75) Inventors: Toshio Kimura, Chiyoda-ku (JP); Takashi Shigematsu, Chiyoda-ku (JP); Shinichiro Iizuka, Chiyoda-ku (JP); Takeshi Aikiyo, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 220 days.

(21) Appl. No.: 09/864,249

(22) Filed: May 25, 2001

(65) Prior Publication Data

US 2002/0003819 A1 Jan. 10, 2002

(30) Foreign Application Priority Data

May 26, 2000 (JP) ........................ 2000-156738

(51) Int. Cl.[7] ............... H01L 23/06; H01S 3/04
(52) U.S. Cl. ............... 372/36; 372/6; 372/34; 257/705; 257/706; 257/930
(58) Field of Search ............... 372/6, 34, 36; 257/705, 706, 930

(56) References Cited

U.S. PATENT DOCUMENTS

| 4,394,530 | A | | 7/1983 | Kaufman |
| 4,979,787 | A | | 12/1990 | Lichtenberger |
| 5,673,349 | A | * | 9/1997 | Kosugi ........................ 385/92 |
| 5,907,185 | A | * | 5/1999 | Tatoh ........................ 257/668 |
| 6,072,814 | A | | 6/2000 | Ryan et al. |
| 6,155,724 | A | * | 12/2000 | Ichino et al. ............... 385/92 |
| 6,422,766 | B1 | * | 7/2002 | Althaus et al. ............... 385/94 |

FOREIGN PATENT DOCUMENTS

JP  05226779 A  *  9/1993  ............ H01S/3/18

* cited by examiner

Primary Examiner—Eddie Lee
Assistant Examiner—Matthew E. Warren
(74) Attorney, Agent, or Firm—Oblon, Spivak, McClelland, Maier & Neustadt, P.C.

(57) ABSTRACT

A bottom plate (4a) of a box-shaped package (4) is made of a metal. Portions of the package (4) (peripheral wall (4b) and cover plate (4c)) other than the bottom plate (4a) are made of a resin or a ceramic that is more economical than the metal. The material cost of the package (4) can thus be reduced in comparison with the case where the package (4) is made of the metal as a whole. A Peltier module (5) is fixed to the bottom plate (4a). A base (6) is fixed over the Peltier module (5), and a semiconductor laser chip (2) is disposed on this base (6). Heat from the semiconductor laser chip (2) and from the Peltier module (5) can be efficiently radiated through the bottom plate (4a) made of the metal, and deterioration of heat radiation performance can be prevented.

10 Claims, 5 Drawing Sheets

SEMICONDUCTOR LASER MODULE WITH PELTIER MODULE FOR REGULATING A TEMPERATURE OF A SEMICONDUCTOR LASER CHIP

BACKGROUND OF THE INVENTION

Semiconductor modules generally have a form in which a distal end of an optical fiber and a semiconductor laser chip are optically connected with each other and are accommodated in a package, for example. The package of such semiconductor laser modules is made of a metal, for example, and a Peltier module is disposed in many cases inside the package to regulate the temperature of the semiconductor laser chip.

SUMMARY OF THE INVENTION

According to one aspect of the present invention, there is provided a semiconductor laser module that comprises an optical fiber, a semiconductor laser chip optically coupled with a distal end of the optical fiber, a box-shaped package for accommodating therein the semiconductor laser chip under an optical coupling state with the distal end of the optical fiber, and a Peltier module fixed to a bottom plate of the package, for regulating the temperature of the semiconductor laser chip, wherein the bottom plate of the package is made of a metal, and at least a peripheral wall portion of the package is made of a resin or a ceramic.

According to another aspect of the present invention, there is provided a semiconductor laser module that comprises an optical fiber, a semiconductor laser chip optically coupled with a distal end of the optical fiber, a box-shaped package for accommodating therein the semiconductor laser chip under an optical coupling state with the distal end of the optical fiber, and a Peltier module disposed inside the package, for regulating a temperature of the semiconductor laser chip, wherein at least a bottom portion and a peripheral wall portion of the package are made of a resin or a ceramic, and an opening is formed in the bottom portion of the package; and wherein the Peltier module is disposed inside the package while the bottom surface thereof is exposed from the opening of the package.

BREIF DESCRIPTION OF THE DRAWINGS

Typical embodiments of the present invention will be described in conjunction with the accompanying drawings, in which.

DESCRIPTION OF THE PREFERRED EMBODIMENTS

Figure 5:
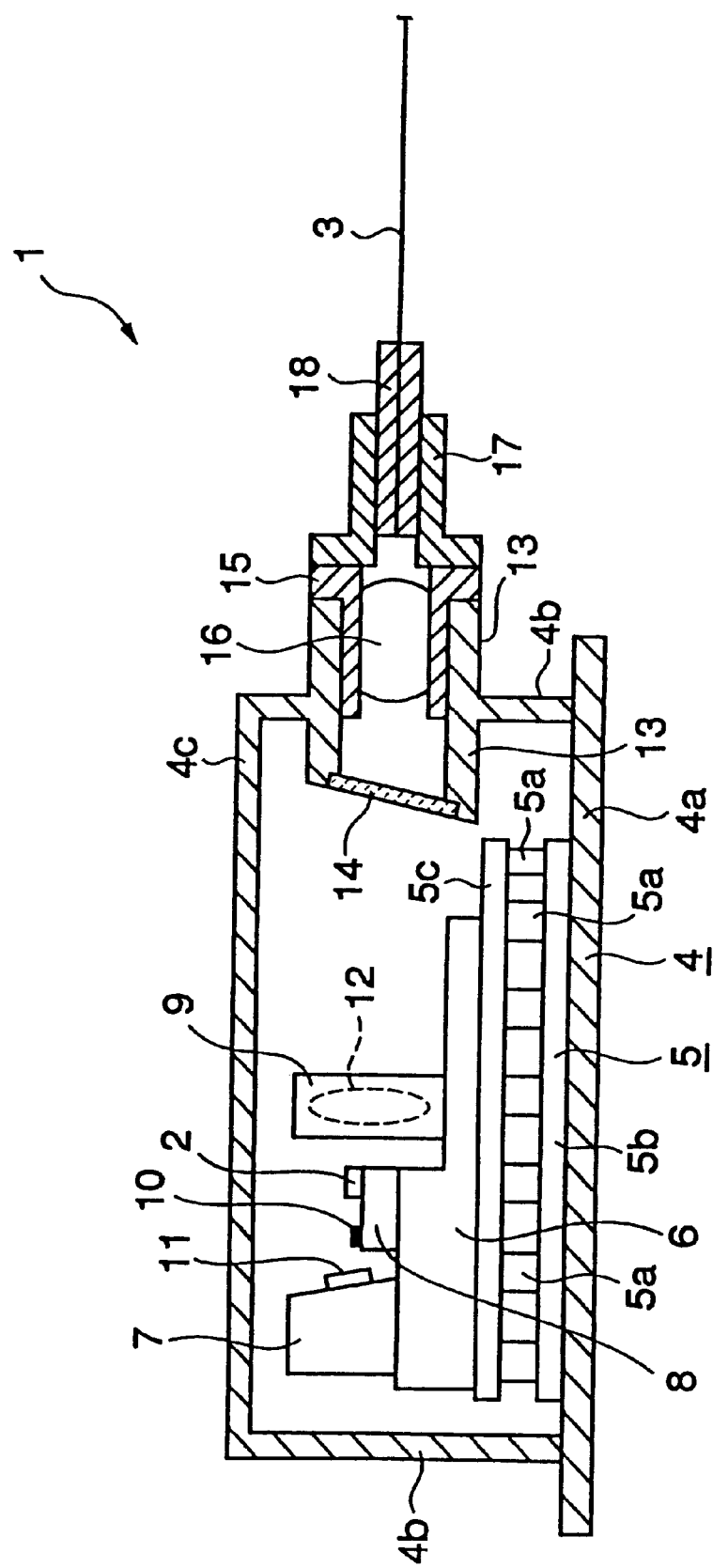
FIG. 5 is a schematic sectional view showing an example of semiconductor laser modules according to the prior art.

FIG. 5 schematically shows the cross-section of a prior art example of a semiconductor laser module. A fabrication method of the semiconductor laser module 1 shown in FIG. 5 comprises the steps of optically coupling a semiconductor laser chip 2 with a distal end of an optical fiber 3, and unifying them together into a module.

Referring to FIG. 5, a Peltier module 5 is shown disposed on a bottom plate 4a of a box-shaped package 4. This Peltier module 5 is fabricated by interposing a plurality of Peltier chips 5a between sheet members 5b and 5c. The sheet member 5b of the Peltier module on the heat radiation side, for example, is fixedly soldered to the bottom plate 4a of the package 4. The sheet members 5b and 5c are made of alumina or a ceramic material such as aluminum nitride.

A base 6 made of a metal is disposed on the sheet member 5c of the Peltier module 5 on the heat absorption side. Tables 7 and 8 and a first lens holder 9 are fixedly mounted to the base 6. The semiconductor laser chip 2 is disposed on the table 8. Also, a semiconductor thermistor 10 is disposed to detect the temperature of this semiconductor laser chip 2. A monitor photodiode 11 is disposed on the table 7 to monitor the light emission state of the semiconductor chip 2. The first lens holder 9 holds a first lens 12.

An opening is formed in an area of a peripheral wall 4b of the package 4 that opposes the semiconductor laser chip 2 through the first lens 12. A cylindrical wall portion 13 is so formed as to protrude from the edge of this opening towards both outside and inside of the package 4. A light transmission window 14 is formed at the opening of this cylindrical wall portion 13 inside the package. A second lens holder 15 is fitted and fixed to the opening of the cylindrical wall portion 13 outside the package. A second lens 16 is fixed inside the second lens holder 15.

A slide ring 17 is fitted to a part of the second lens holder 15 outside the package. A ferule 18 is fitted into the slide ring 17. The distal end of the optical fiber 3 is fitted and fixed to the ferule 18.

The semiconductor laser chip 2, the first lens 12, the second lens 16 and the distal end of the optical fiber 3 are positioned so that the semiconductor laser chip 2 and the distal end of the optical fiber 3 establish a satisfactory optical coupling state, and are fixed under such a state.

The inside of the package 4 is hermetically sealed. The inside of the package 4 thus sealed keeps an atmosphere of a dry inert gas. Consequently, the semiconductor laser chip 2 and an electric circuit accommodated in the package 4 are prevented from being broken by dew drop.

When the semiconductor laser chip 2 emits a laser beam in the semiconductor laser module 1 described above, the laser beam so emitted is condensed by a coupling optical system comprising the first lens 12 and the second lens 16 and is then incident into the optical fiber 3. The laser beam propagates inside the optical fiber 3, and is employed for a desired application.

The intensity of the laser beam emitted from the semiconductor laser chip 2 and its wavelength vary in accordance with the temperature of the semiconductor laser chip 2 itself. In order to keep the intensity of the laser beam and its wavelength constant, therefore, the current feed quantity to the Peltier module 5 is controlled on the basis of the output value from the thermistor 10, and temperature control of the semiconductor chip 2 is performed. This temperature control can keep the semiconductor laser chip 2 at a substantially constant temperature. In other words, the intensity of the laser beam emitted from the semiconductor laser chip 2 and its wavelength can be kept substantially constant.

A heat sink (not shown) is disposed in most cases below the semiconductor laser module 1. In this case, heat generated from the semiconductor laser chip 2 and the Peltier module 5 inside the package 4 is radiated to the heat sink through the bottom plate 4a of the package 4. The bottom plate 4a of the package 4 is made of a metal to allow a smooth flow of this heat radiation. The bottom plate 4a, in particular, is made in most cases of a metal having a coefficient of thermal expansion approximate to that of the sheet member 5b of the Peltier module 5, and having a high thermal conductivity (such as CuW alloy).

The peripheral wall 4b and the cover plate 4c of the package 4 are made in most cases of a metal having low thermal conductivity (such as a Fe—Ni—Co alloy) among a large number of metals for the following reasons. The peripheral wall 4b of the package 4 and its cover plate 4c are bonded by welding such as seam welding (resistance welding) to hermetically seal the inside of the package 4. The second lens holder 15 is made of a metal such as a stainless steel, and is fixed to the cylindrical wall portion 13 of the peripheral wall 4b by welding such as YAG welding. Thus, the peripheral wall 4b and the cover plate 4c of the package 4 have the portions to be welded, respectively. To secure weldability, therefore, the peripheral wall 4b and the cover plate 4c of the package 4 are made in most cases of a metal having low thermal conductivity among a large number of metals.

When all of the bottom plate 4a, the peripheral wall 4b and the cover plate 4c constituting the package 4 are made of a metallic material, however, the material cost of the package 4 is high and hinders the reduction of the cost of the semiconductor laser module 1.

Therefore, it may be conceivable to constitute the package 4 from a resin as a whole so as to lower the material cost of the package 4. However, when the package 4 is wholly made of a resin, the problem of heat radiation develops. The resins generally have by far lower thermal conductivity than metals, and cannot satisfactorily radiate heat generated from the semiconductor laser chip 2 and the Peltier module 5 to the heat sink through the bottom plate 4a of the package 4.

When the heat radiation property of the semiconductor laser module 1 thus drops, a large load is applied to the Peltier module 5 with the result of the increase of power consumption of the Peltier module 5. Therefore, such a semiconductor laser module 1 cannot be substantially used in a high temperature atmosphere such as not less than 70° C.

The present invention provides, in one of its aspects, a semiconductor laser module that solves the problems of the production cost and heat radiation performance.

Hereinafter, semiconductor laser modules according to several preferred embodiments of the present invention will be described with reference to the accompanying drawings.

Figure 1:
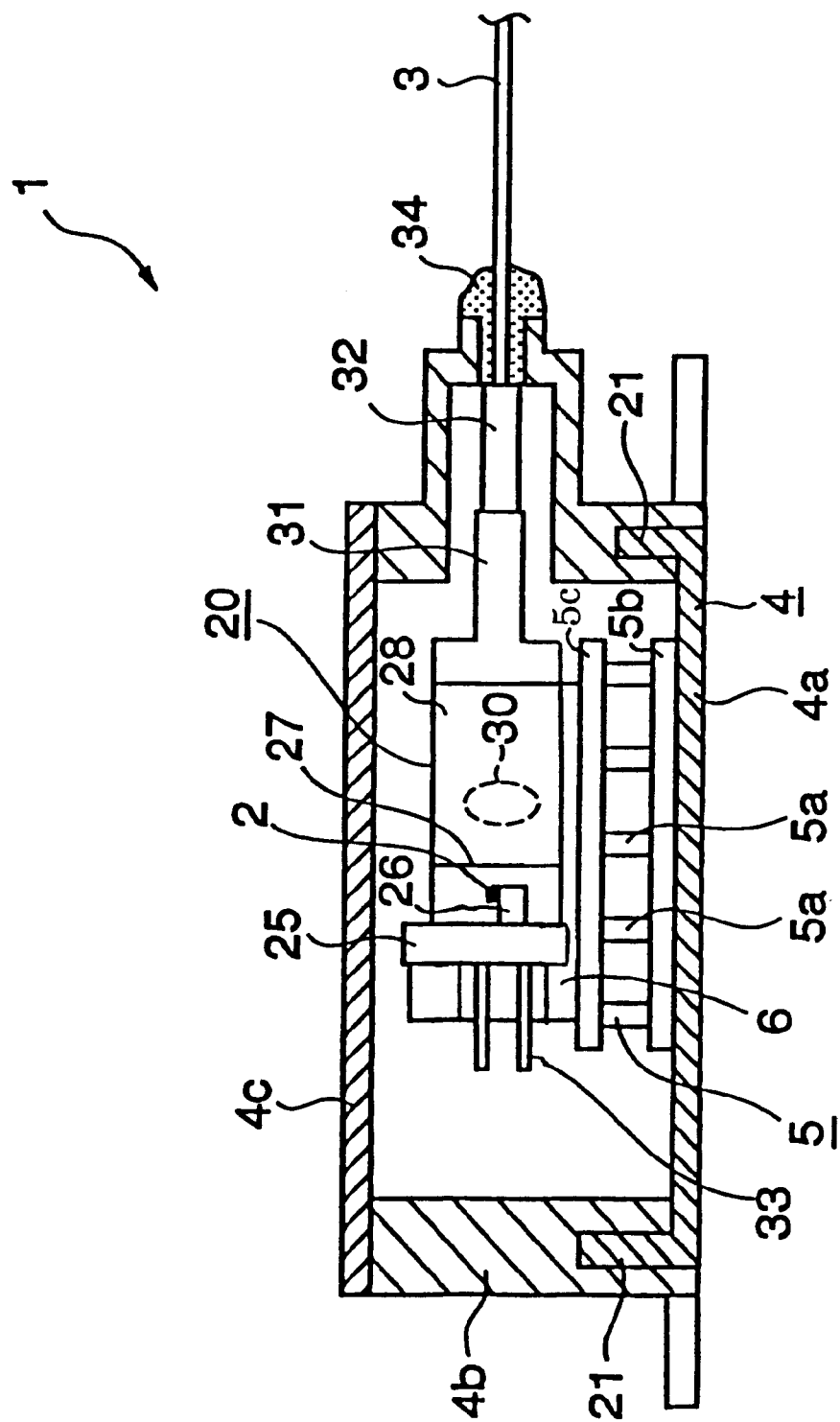
FIG. 1 is a schematic cross-sectional view showing a semiconductor laser module according to a first embodiment of the present invention.

FIG. 1 is a schematic cross-sectional view showing a semiconductor laser module according to the first embodiment of the present invention. This first embodiment is different from the prior art example described above in that the bottom plate 4a of the package 4 is made of a metal, and the remaining peripheral wall 4b and cover plate 4c are made of a resin. In this first embodiment, the semiconductor laser chip 2 and the distal end of the optical fiber 3 are arranged and accommodated in the form of the internal module 20 inside the package 4. This construction, too, is different from the prior art example.

Figure 2:
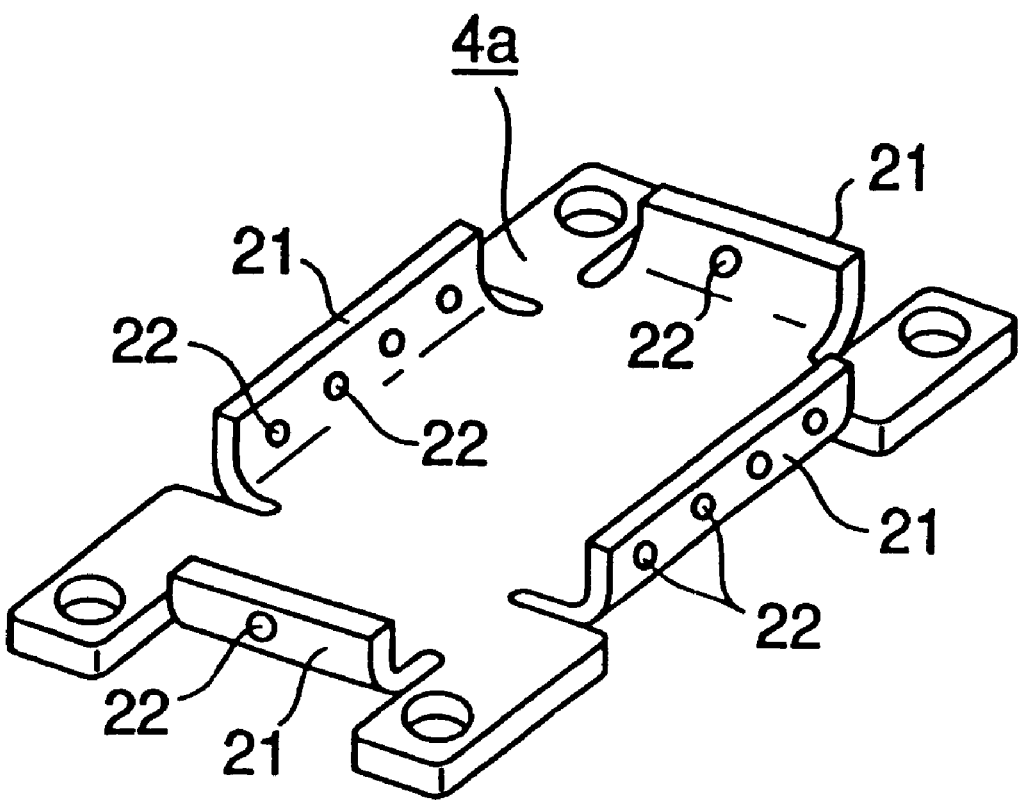
FIG. 2 is a perspective view showing schematically an example of a bottom plate of a package constituting the semiconductor laser module according to the first embodiment.

In the first embodiment, the package 4 has a box shape and includes the bottom plate 4a as shown in FIG. 2. The bottom plate 4a is made of a metal. One of the metals that can constitute the bottom plate 4a is CuW. An anchor rib 21 is so implanted as to protrude upward at the peripheral portion of the bottom plate 4a. Various methods are available for producing such a bottom plate 4a and any of them may be employed. For example, a method that shapes metal powder by MIM (Metal Injection Molding) or press working of a metal sheet can be employed.

In this embodiment, the peripheral wall 4b is implanted onto the bottom plate 4a. The peripheral wall 4b is made of a resin. Examples of the resin materials for forming the peripheral wall 4b include thermoplastic resins (so-called "engineering plastics") such as liquid crystal polymers (LCP), polyether ether ketone (PEEK), polyether imide, polyphenyl sulfide (PPS), polybutylene terephthalate (PBT), polyphenylene ether (PPE), polycarbonate (PC), polyamides, and so forth, besides epoxy type thermosetting resins (used widely for molding IC, for example) and phenol type thermosetting resins. Needless to say, other resins may be used, too. The resin containing glass filler or glass bead may also be used for forming the peripheral wall 4b. When the mixing proportion is appropriately selected, the coefficient of linear expansion of the peripheral wall 4b can be regulated. When the glass bead is used, the size of the bead is not limited but its mean particle diameter is preferably up to 30 $\mu$m.

In this first embodiment, the anchor rib 21 of the bottom plate 4a is buried in the peripheral wall 4b as shown in FIG. 1. The peripheral wall 4b made of the resin is shaped on the bottom plate 4a by a molding technology (such as injection molding). A concrete example is as follows. When the peripheral wall 4b is made of the thermosetting resin, for example, transfer molding is employed. When the peripheral wall 4b is made of the thermoplastic resin, injection molding is employed. When adhesion between the bottom plate 4a made of the metal and the peripheral wall 4b made of the resin and moisture resistance are taken into consideration, however, it is preferred to transfer-mold a thermosetting epoxy resin, but the material is not restrictive.

Since the peripheral wall 4b of the resin is formed on the bottom plate 4a by the molding technology in the first embodiment, the peripheral wall 4b is assembled and fixed into the bottom plate 4a simultaneously with molding. In consequence, the production process of the semiconductor laser module 1 can be simplified in comparison with the production process that first forms the peripheral wall 4b and then fits the peripheral wall 4b to the bottom plate 4a.

Referring to FIG. 2, the anchor rib 21 of the bottom plate 4a is shown equipped with a plurality of small holes 22 in the first embodiment by way of example. When the peripheral wall 4b is molded, the molten resin material flows into the small holes 22 and is set under this state. As a result, a part of the peripheral wall 4b is fitted into each small hole 22, and fall-off of the peripheral wall 4b from the bottom plate 4a can be prevented. Further, mechanical reliability of the semiconductor laser module 1 can be improved.

Referring back to FIG. 1, the Peltier module 5 is fixed to the bottom plate 4a by soldering, for example. The base 6 is fixed onto the Peltier module 5 by an adhesive, for example. The internal module 20 is fixed onto the base 6 by an adhesive, for example. Various adhesives are available for fixing the Peltier module 5 to the base 6 and the base 6 to the internal module 20, and any of them may be used. When heat radiation of heat of the semiconductor laser chip 2 to the outside is taken into consideration, however, the adhesive material preferably has high heat conductivity. Examples of such adhesive materials are solder and silver paste or the like.

The internal module 20 in this first embodiment is a coaxial type laser module. The internal module 20 has a stem 25. The semiconductor laser chip 2 is fixed to this stem 25 through a support part 26. A cap 27 is so fitted to the step as to cover the semiconductor laser chip 2 through a space. YAG welding, for example, is employed to fix one of the ends of a cylindrical lens holder 28 to the cap 27. A condenser lens 30 is fixed inside the lens holder 28.

A slide ring 31 is fitted to the other end of the lens holder 28. The distal end side of a ferule 32 is fitted into the slide ring 31. The distal end side of an optical fiber 3 is fitted and fixed to the ferule 32. The semiconductor laser chip 2, the condenser lens 30 and the distal end of the optical fiber 3 are positioned in such a fashion that the distal end of the optical fiber 3 is optically coupled with the semiconductor laser chip 2 through the condenser lens 30. In the first embodiment, the stem 25, the cap 27, the lens holder 28, the slide ring 31 and the ferule 32 are fixed and unified with one another while positioning described above is kept established.

Incidentally, reference numeral 33 in the drawings denotes a lead wire. The lead wire 33 is conductively connected to the circuit inside the space sealed by the stem 25 and the cap 27. In the first embodiment, the inside of the internal module 20 keeps an atmosphere of a dry inert gas. A photodiode is disposed inside the internal module 20 to monitor the light emission state of the semiconductor laser chip 2, but is omitted from FIG. 1. Similarly, a thermistor is provided to the base 6 to detect the temperature of the semiconductor laser chip 2, but is omitted in FIG. 1.

When the internal module 20 is soldered to the base 6, the resin portion of the package 4 such as the peripheral wall 4b is likely to undergo deformation depending on the kind of the resin material when soldering is performed by reflow. When deformation of the resin portion is the matter of concern, a current is caused to flow through the upper sheet member 5c of the Peltier module 5 for heating in place of reflow during the soldering step. In this way, the solder disposed between the base 6 and the internal module 20 is molten to solder the base 6 and the internal module 20. When soldering is performed in this way, the package 4 can be prevented from being excessively heated, and thermal deformation of the peripheral wall 4b made of the resin, etc, can be avoided.

The optical fiber 3 taken out from the internal module 20 is extended out from the opening formed in the peripheral wall 4b. A seal member 34 closes this opening. The seal member 34 fixes the optical fiber 3.

While the Peltier module 5, the base 6 and the internal module 20 are arranged, the cover plate 4c is fixed onto the peripheral wall 4b to seal the inside of the package 4.

In the first embodiment, the portions of the package 4 other than the bottom plate 4a are made of the resin that is more economical than the metal. Therefore, the material cost of the package can be reduced by far greatly than when the package 4 is made of a metal as a whole.

Moreover, because the bottom plate 4a of the package 4 coming into contact with the Peltier module 5 is made of the metal, heat generated from the semiconductor laser chip 2 and the Peltier module 5 can be efficiently radiated to the outside through the bottom plate 4a made of the metal.

Accordingly, the first embodiment can provide the semiconductor laser module 1 capable of preventing the drop of heat radiation performance and usable in a high temperature atmosphere while reducing the material cost of the package 4.

In the first embodiment, the semiconductor laser chip 2 and the distal end of the optical fiber 3 are constituted into the module under the optical coupling state and form the internal module 20. This internal module 20 is disposed over the Peltier module 5 through the base 6. Therefore, this construction can prevent the following problem.

The problem is as follows. Referring to FIG. 5, for example, the semiconductor laser chip 2 and the first lens 12 are disposed on the metal base 6 inside the package 4. The second lens holder 15 made of the metal and the slide ring 17 fix the second lens 16 and the distal end of the optical fiber 3 to the peripheral wall 4b of the package 4. If the peripheral wall 4b of the package 4 is made of a resin in the construction shown in FIG. 5, positioning errors develop between the semiconductor laser device 2 and the first lens 12 and between the second lens 16 and the distal end of the optical fiber 3 due to the difference of the coefficients of thermal expansion between the metal and the resin when the ambient temperature of the semiconductor laser module 1 rises.

The semiconductor laser chip 2, the first lens 16 and the distal end of the optical fiber 3 are centered and fixed with positioning accuracy of a micrometer level. Therefore, even when a slight positioning error occurs, the optical coupling state between the semiconductor laser chip 2 and the distal end of the optical fiber 3 gets deteriorated and the optical output of the semiconductor laser module 1 remarkably drops.

In contrast, in the first embodiment, the distal end of the optical fiber 3 is optically coupled with the semiconductor laser chip 2 through the condenser lens 30 and is constituted under this state into the module, forming the internal module 20. This internal module 20 is disposed on the base 6. Consequently, even when any change occurs in the ambient temperature, the problem of the positioning error between the semiconductor laser chip 2 and the distal end of the optical fiber 3 can be avoided. In other words, the problem of deterioration of the optical coupling state resulting from the rise of the ambient temperature can be reliably prevented, and the semiconductor laser module 1 usable under the high temperature environment can be obtained more reliably.

When the resin or the ceramic is used to form the peripheral wall 4b of the package 4, it is difficult in the construction shown in FIG. 5 to fix the peripheral wall 4b and the slide ring 17 by YAG welding. Therefore, when the slide ring 17 is fixed to the peripheral wall 4b by using other fixing means such as bonding, the stable optical coupling state between the distal end of the optical fiber 3 and the semiconductor laser chip 2 might collapse.

In the first embodiment, in contrast, the distal end of the optical fiber 3 and the semiconductor laser chip 2 are unified under the optical coupling state into the module. Therefore, even when the resin or the ceramic is used to form the peripheral wall 4b, the optical coupling state between the distal end of the optical fiber 3 and the semiconductor laser chip 2 can be kept stable irrespective of the fixing means employed.

Further, when the resin is used for the package 4, the gas generated from the resin might adhere to the end face of the semiconductor laser chip 2, thereby inviting the problem such as the drop of the optical output of the semiconductor laser chip 2. In contrast, the first embodiment, the semiconductor laser chip 2 is accommodated into the internal module 20 and it can therefore solve such a problem.

The construction of the first embodiment is particularly effective when the semiconductor laser module is equipped with a semiconductor laser chip 2 for exciting a 1,480 nm-band Er-doped fiber amplifier that generates large heat.

Next, a semiconductor laser module according to the second embodiment of the present invention will be described.

Figure 3:
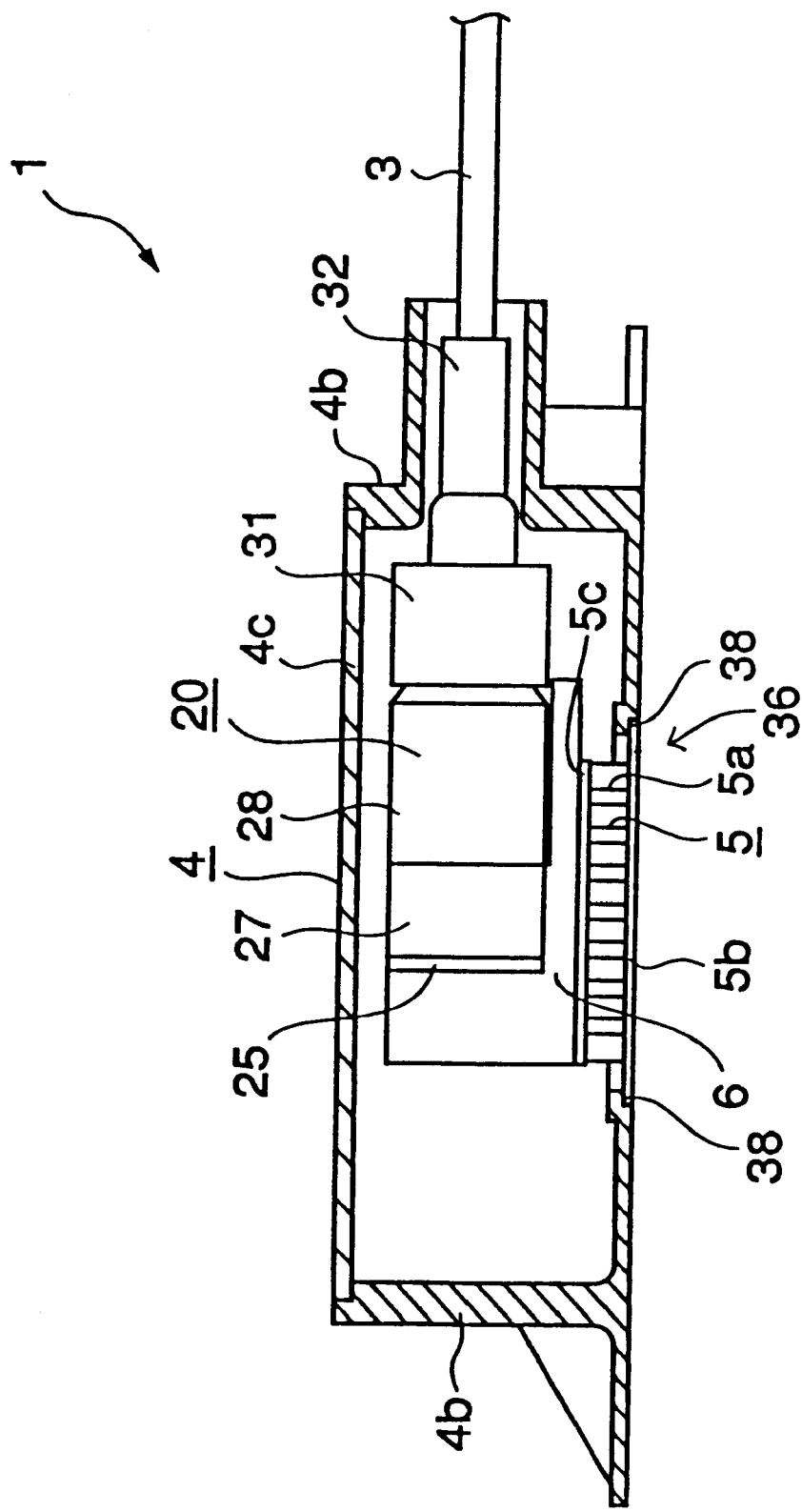
FIG. 3 is a schematic cross-sectional view showing a semiconductor laser module according to a second embodiment of the present invention.

In this embodiment, the package 4 is made of a resin as a whole. A hole portion 36 is defined in the bottom of this package 4 as shown in FIG. 3, and the bottom surface of the Peltier module 5 is exposed from the opening of this hole portion 36. The rest of the constructions are substantially the same as the construction of the first embodiment.

Various resin materials can be used to form the package 4 and any of them can be employed. For example, the package 4 can be formed from the concrete example of the resin materials for forming the peripheral wall 4b of the package 4 described in the first embodiment.

In this second embodiment, the Peltier module 5 is disposed in such a fashion that its bottom surface is exposed from the opening of the hole portion 36 of the package 4. The bottom surface of the Peltier module 5 exposed from the opening lies substantially in the same level as the bottom surface of the package 4. Accordingly, when the heat sink is disposed on the bottom surface side of the semiconductor laser module 1, the bottom surface of the Peltier module 5 can be directly brought into contact with the heat sink.

In the second embodiment, the sheet member 5b on the lower side (heat radiation side) of the Peltier module 5 is formed into a greater size than the sheet member 5c on the upper side (heat absorption side) as shown in FIG. 3. The hole portion 36 of the bottom of the package 4 becomes narrower step-wise (two stages in the example shown) from the outside to the inside of the package 4. The sheet member 5b of the Peltier module 5 on the heat radiation side is anchored to the step portion 38, thereby executing positioning of the Peltier module 5.

According to this construction, the Peltier module 5 can be easily positioned to the bottom of the package 4 and can be easily bonded and fixed. The sheet member 5b reliably closes the opening of the hole portion 36 and can hermetically seal the inside of the package 4.

Heat radiation performance can be improved when the size of the sheet member 5b of the Peltier module 5 on the heat radiation side is increased.

In the second embodiment, the package 4 is formed from the resin as a whole. Therefore, the material cost of the package 4 can be further reduced, and the production cost of the semiconductor laser module 1 can be eventually reduced. Moreover, the hole portion 36 is defined in the bottom of the package 4 and the bottom surface of the Peltier module 5 is exposed from the opening of the hole portion 36. Therefore, heat radiation performance of the semiconductor laser module 1 can be improved.

In the second embodiment, the bottom surface of the Peltier module 5 and the bottom surface of the package 4 are arranged substantially on the same level. Therefore, the bottom surface of the Peltier module 5 can be brought into direct contact with the heat sink. In consequence, heat can be radiated more efficiently and directly from the bottom surface of the Peltier module 5 to the heat sink, and heat radiation performance of the Peltier module 5 can be drastically improved.

Since the sheet member 5b of the Peltier module 5 on the heat radiation side is buried into the bottom of the package 4, the thickness of the semiconductor laser module can be reduced much more than when the sheet member 5b of the Peltier module 5 on the heat radiation side is fixed onto the bottom plate of the package 4.

In the second embodiment, the semiconductor laser chip 2 and the distal end of the optical fiber 3 are arranged and accommodate in the form of the internal module 20 inside the package 4 in the same way as in the first embodiment. Therefore, even when the peripheral wall 4b of the package 4 is formed from the resin, the problem of deterioration of the optical coupling state resulting from the rise of the ambient temperature can be prevented reliably. Difficulty encountered in stabilizing the optical coupling state that results from difficulty in YAG welding can also be prevented. Further, the problem of the drop of the optical output of the semiconductor laser chip 2 due to adhesion of the volatile gas occurring from the resin of the peripheral wall 4b to the end face of the semiconductor laser chip 2 can be prevented, too.

Incidentally, the present invention is not particularly limited to each of the foregoing embodiments but can assume various other forms. For example, the package 4 other than its bottom plate 4a is made of the resin in the first embodiment and the package 4 is made as a whole of the resin in the second embodiment. However, the package 4 other than the bottom plate 4a in the first embodiment and the whole package 4 in the second embodiment may be formed from alumina or ceramics such as aluminum nitride, or other materials.

In the first embodiment, the cover plate 4c of the package 4 is made of the same resin as that of the peripheral wall 4b or the ceramic, but the cover plate 4c may be made of a metal. In the second embodiment, the whole package 4 is made of the resin or the ceramic, but the cover plate 4c of the package 4 may be made of a metal.

In the first embodiment, the small holes 22 are bored in the anchor rib 21 to prevent fall-off of the peripheral wall 4b. However, these small holes 22 need not be formed when fall-off preventing measure is employed such as when the bottom plate 4a and the peripheral wall 4b are made of materials having extremely high mutual bondability in combination with each other or when the distal end of the anchor rib 21 is bent to prevent fall-off of the peripheral wall 4b or when sufficient fixing strength can be secured between the anchor rib 21 and the peripheral wall 4b.

In each of the foregoing embodiments, the semiconductor laser chip 2 and the distal end of the optical fiber 3 are accommodated in the form of the internal module 20 inside the package 4, but they need not always take the form of the internal module 20.

Figure 4:
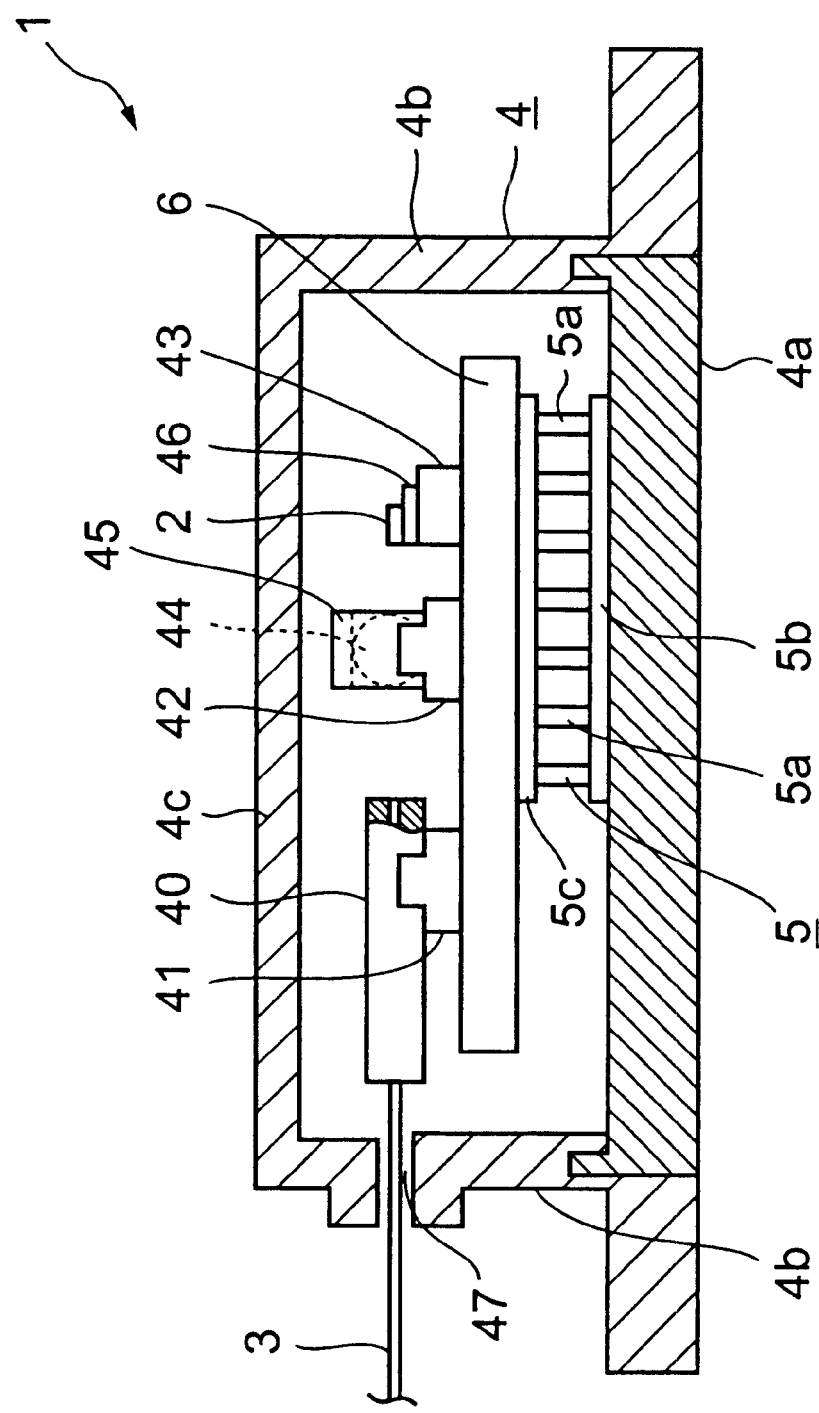
FIG. 4 is a schematic sectional view showing another embodiment.

For example, both of the distal end of the optical fiber 3 and the semiconductor laser chip 2 may be fixed onto the base 6 as shown in FIG. 4. In the example shown in FIG. 4, the distal end of the optical fiber 3 is fitted and fixed into an optical fiber support member 40. The optical fiber support member 40 is in turn fixed onto the base 6 by using a fixing member 41. A lens fixing member 42 and a laser chip fixing member (chip carrier) 43 are fixedly disposed on the base 6. The laser chip fixing member 43 fixes the semiconductor laser chip 2 onto the base 6. A lens 44 is fixed onto the base 6 between the distal end of the optical fiber 3 and the semiconductor laser chip 2 through a lens holder 45 and a lens fixing member 42.

Incidentally, the distal end of the optical fiber 3 and the laser chip 2 are positioned and fixed at positions that are suitable for them to be optically coupled through the lens 44. A seal member, not shown, is provided to a through-hole 47 of the package 4 through which the optical fiber 3 passes. The inside of the package 4 is thus kept airtight. Reference numeral 46 in FIG. 4 denotes the heat sink.

In the construction shown in FIG. 4, the distal end of the optical fiber 3 and the semiconductor laser chip 2 are optically coupled by using the lens 44. However, it is also possible to employ the construction in which the distal end of the optical fiber 3 is optically coupled with the semiconductor laser chip 2 by using a lensed fiber processed into a lens. In this case, the lens 44 shown in FIG. 4 can be omitted. Further, both of the distal end of the optical fiber (lensed fiber) 3 and the semiconductor laser chip 2 are fixed onto the base 6 in this case, too. Therefore, even when the peripheral wall 4b of the package 4 undergoes thermal expansion, the optical coupling state between the distal end of the optical fiber 3 and the semiconductor laser chip 2 is not spoiled, and the semiconductor laser module can be used under a high temperature environment.

In the example shown in FIG. 4, the Peltier module 5 is fixed onto the bottom plate 4a of the package 4 as illustrated in the first embodiment. Needless to say, the bottom surface of the Peltier module 5 may be exposed from the opening of the bottom of the package 4 as illustrated in the second embodiment.

In the second embodiment, the bottom surface of the Peltier module 5 exposed from the opening of the bottom of the package 4 substantially lies in the same level as the bottom surface of the package 4. However, the bottom surface of the Peltier module 5 needs be exposed from the opening of the bottom of the package 4 and may well protrude from the bottom surface of the package 4, for example. Though the bottom surface of the Peltier module 5 may be recessed from the bottom surface of the package 4, it more preferably exists on the same level as, or protrudes from, the bottom surface of the package 4 when adhesion between the Peltier module 5 and the heat sink is taken into account.

What is claimed is:

1. A semiconductor laser module comprising:
   an optical fiber;
   a semiconductor laser chip optically coupled with a distal end of said optical fiber;
   a box-shaped package for accommodating therein said semiconductor laser chip under an optical coupling state with the distal end of said optical fiber; and
   a Peltier module fixed to a bottom plate of said package, for regulating the temperature of said semiconductor laser chip;
   wherein the bottom plate of said package is made of a metal, and at least a peripheral wall portion of said package is made of a resin or a ceramic, and
   wherein an anchor rib is buried into the peripheral wall of said package, and the bottom plate of said package is integrally fixed to, and unified with, peripheral wall.

2. A semiconductor laser module according to claim 1, wherein the peripheral wall of said package is assembled and fixed to the bottom plate by injection molding.

3. A semiconductor laser module comprising:
   an optical fiber;
   a semiconductor laser chip optically coupled with a distal end of said optical fiber;
   a box-shaped package for accommodating therein said semiconductor laser chip under an optical coupling state with the distal end of said optical fiber; and
   a Peltier module disposed inside said package, for regulating a temperature of said semiconductor laser chip;
   wherein at least the bottom portion and a peripheral wall portion of said package are made of a resin or a ceramic, and an opening is formed in the bottom portion of said package; and
   wherein said Peltier module is disposed inside said package such that a bottom surface of said Peltier module is exposed from said opening of said package.

4. A semiconductor laser module according to claim 3, wherein the bottom surface of said Peltier module exposed from said opening of said package is arranged substantially coplanar with the bottom surface of said package.

5. A semiconductor laser module comprising:
   an optical fiber;
   a semiconductor laser chip optically coupled with a distal end of said optical fiber;
   a box-shaped package for accommodating therein said semiconductor laser chip under an optical coupling state with the distal end of said optical fiber; and
   a Peltier module fixed to a bottom plate of said package, for regulating the temperature of said semiconductor laser chip;
   wherein the bottom plate of said package is made of a metal, and at least a peripheral wall portion of said package is made of a resin or ceramic, and
   wherein a distal end of said optical fiber and said semiconductor laser chip are unified into a module under an optical coupling state to constitute an internal module with said optical fiber fixedly connected to the internal module, and said internal module is disposed over said Peltier module either directly or indirectly through a base.

6. A semiconductor laser module according to claim 5, wherein both of the distal end of said optical fiber and said semiconductor laser chip are fixed over said Peltier module through a base.

7. A semiconductor laser module according to claim 5, wherein an anchor rib is buried into the peripheral wall of said package, and the bottom plate of said package is integrally fixed to, and unified with, the peripheral wall.

8. A semiconductor laser module comprising:
   an optical fiber;
   a semiconductor laser chip optically coupled with a distal end of said optical fiber;
   a box-shaped package for accommodating therein said semiconductor laser chip under an optical coupling state with the distal end of said optical fiber; and
   a Peltier module disposed inside said package, for regulating a temperature of said semiconductor laser chip;
   wherein at least the bottom portion and a peripheral wall portion of said package are made of a resin or a ceramic, and an opening is formed in the bottom portion of said package; and
   wherein said Peltier module is disposed inside said package such that a bottom surface thereof is exposed from said opening of said package, and
   wherein a distal end of said optical fiber and said semiconductor laser chip are unified into a module under an optical coupling state to constitute an internal module with said optical fiber fixedly connected to the internal module, and said internal module is disposed over said Peltier module either directly or indirectly or through a base.

9. A semiconductor laser module according to claim 8, wherein both of the distal end of said optical fiber and said semiconductor laser chip are fixed over said Peltier module through a base.

10. A semiconductor laser module according to claim 7, wherein the peripheral wall of said package is assembled and fixed to the bottom plate by injection molding.

* * * * *